United States Patent
Luu

(10) Patent No.: US 7,369,819 B2
(45) Date of Patent: May 6, 2008

(54) DIGITAL AMPLITUDE MODULATION TRANSMITTER WITH PULSE WIDTH MODULATING RF DRIVE

(75) Inventor: Ky Thoai Luu, Victor, NY (US)

(73) Assignee: Harris Corporation, Melbourne, FL (US)

( * ) Notice: Subject to any disclaimer, the term of this patent is extended or adjusted under 35 U.S.C. 154(b) by 474 days.

(21) Appl. No.: 11/105,692

(22) Filed: Apr. 14, 2005

(65) Prior Publication Data

US 2006/0252388 A1    Nov. 9, 2006

(51) Int. Cl.
*H03C 1/52* (2006.01)
*H04B 1/02* (2006.01)
*H01Q 11/12* (2006.01)

(52) U.S. Cl. .................... 455/91; 455/108; 455/116; 375/300

(58) Field of Classification Search ........ 455/108–109, 455/127.1, 127.3, 107, 116; 375/300–301; 330/51, 200, 10, 136
See application file for complete search history.

(56) References Cited

U.S. PATENT DOCUMENTS

| | | | | |
|---|---|---|---|---|
| 4,122,415 A | * | 10/1978 | Luther et al. ............... | 332/152 |
| 4,580,111 A | | 4/1986 | Swanson | |
| 6,097,615 A | * | 8/2000 | Dent ........................... | 363/43 |
| 6,147,553 A | * | 11/2000 | Kolanek ...................... | 330/10 |
| 6,201,452 B1 | * | 3/2001 | Dent et al. .................. | 332/103 |
| 6,294,957 B1 | | 9/2001 | Luu | |
| 6,411,655 B1 | * | 6/2002 | Holden et al. ............... | 375/269 |
| 6,480,465 B1 | * | 11/2002 | Luu ............................. | 310/46 |
| 6,859,098 B2 | * | 2/2005 | Husseini ..................... | 330/133 |
| 6,889,034 B1 | * | 5/2005 | Dent .......................... | 455/102 |
| 7,091,778 B2 | * | 8/2006 | Gan et al. ................... | 330/136 |
| 7,099,635 B2 | * | 8/2006 | McCune ..................... | 455/110 |
| 7,187,231 B2 | * | 3/2007 | McGrath et al. ............. | 330/51 |
| 7,212,069 B2 | * | 5/2007 | Schell et al. ................ | 330/10 |
| 2004/0124916 A1 | * | 7/2004 | Kontson ...................... | 330/51 |

* cited by examiner

*Primary Examiner*—Simon D. Nguyen
(74) *Attorney, Agent, or Firm*—Tarolli, Sundheim, Covell & Tummino LLP

(57) ABSTRACT

A digital amplitude modulation (AM) transmitter with pulse width modulating RF drive is presented. A plurality of RF amplifiers, each, when turned on, amplifies an applied RF drive signal by the same amount to provide a unit step RF output. An encoder supplies turn-on signals to turn on a number of the RF amplifiers wherein the number varies as a function of the value of an applied audio signal. The width of the unit step RF output is varied as a function of the number of the RF amplifiers that are turned on.

7 Claims, 3 Drawing Sheets

DIGITAL AMPLITUDE MODULATION TRANSMITTER WITH PULSE WIDTH MODULATING RF DRIVE

BACKGROUND OF THE INVENTION

This invention relates to the art of AM radio broadcasting and, more particularly, to an RF power amplifier system of the type employed in AM radio broadcasting and employing digital amplitude modulation with pulse width modulating RF drive.

The patent to H. I. Swanson (U.S. Pat. No. 4,580,111) and the patent to K. T. Luu (U.S. Pat. No. 6,294,957) disclose an amplitude modulator for use in AM radio broadcasting and wherein the modulator serves to generate an amplitude modulated signal by selectively turning on and off a plurality of RF amplifiers in a digital manner to produce amplitude modulation. The amplifiers are essentially identical and each produces a signal of the same magnitude and duration known as a unit step or big step. The amplifiers are connected together in series so that big step signals are additive when combined and applied to a load, which may include a broadcasting antenna.

A drive system supplies an RF signal which is passed and amplified by each amplifier that is turned on. This is an efficient way to generate an amplitude modulated envelope signal. The envelope has a very high fidelity and low distortion because of the benefit of the wider bandwidth and digital resolution. In the case of a modern AM broadcast transmitter, very high positive peak modulation is required. Typical, peak modulation is +125% to +150% or higher to meet some requirement with the arrival of digital radio transmission.

Implementation of this modulation technique has been accomplished by using equal steps of power amplifiers which, when turned on, provide equal big steps. However, this technique has required lots of the same power amplifiers to achieve good resolution and, hence, cost may be significant. Thus, to produce a 12-bit resolution signal, the system may require more than 1000 power amplifiers, each providing the same magnitude big step.

It has been known in the prior art to implement the above method with the use of binary weighted power amplifiers to reduce the number of power amplifiers. This type of system includes power amplifiers that provide big steps as well as some power amplifiers that provide little or fractional steps. This helps reduce the number of power amplifiers but the technique has many limitations because the power amplifiers are not exactly the same and, hence, there are variations in group delay, power gain, RF drive phase alignment with respect to each other. This may create non-linearities which are difficult to correct.

The present invention is directed toward improvements permitting the use of a plurality of power amplifiers each providing an output of the same size and, hence, eliminating the need for big step and little step amplification. This is achieved in accordance with the present invention as will be described herein.

SUMMARY OF THE INVENTION

In accordance with the present invention, a digital amplitude modulation transmitter is provided having pulse width modulating RF drive. This transmitter includes a plurality of RF amplifiers, each when turned on, amplifying an applied RF drive signal by the same amount to provide a unit step RF output. An encoder supplies turn-on signals to turn on a number of the RF amplifiers wherein the number of amplifiers that are turned varies as a function of the value of an applied audio signal. The width of the unit step output is varied as a function of the number of the RF amplifiers that are turned on.

In accordance with a more limited aspect of the present invention, the pulse width is varied inversely with the magnitude of the applied audio signal.

BRIEF DESCRIPTION OF THE DRAWINGS

The foregoing and other objects and advantages of the present invention will become more readily apparent from the following description as taken in conjunction with the accompanying drawings, wherein.

DESCRIPTION OF THE PREFERRED EMBODIMENT

One application of the present invention is in conjunction with RF power amplifiers employed in an AM broadcast transmitter. An example of such a transmitter is presented in FIG. 1 and takes the form of a digital amplitude modulator such as that illustrated and described in the aforesaid U.S. Pat. No. 4,580,111.

The discussion that follows is directed to an explanation of the operation of the circuitry shown in FIG. 1 which serves as background for the discussion of the invention presented hereinafter.

Figure 1:
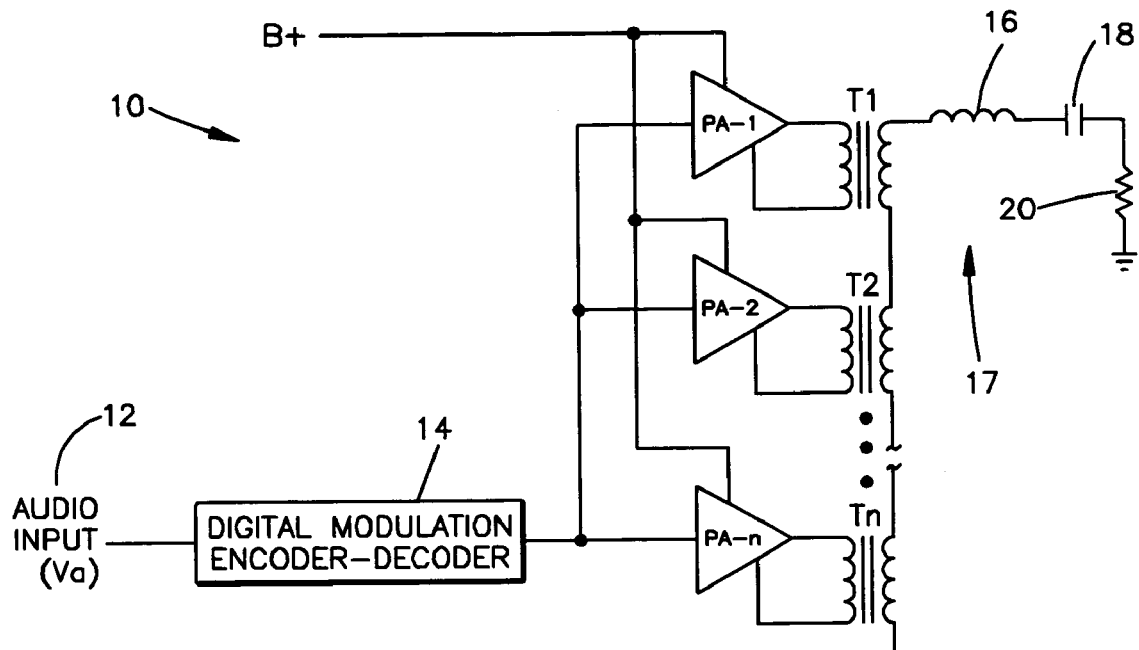
FIG. 1 is a prior art schematic-block diagram illustration of one application to which the present invention may be applied.

Referring now to FIG. 1, the amplitude modulator 10 is illustrated as receiving an audio input signal 12 at a digital modulation encoder-decoder 14. This encoder-decoder 14 selects one or more of a plurality of power amplifiers PA-1/PA-n to be turned on. These are equal amplitude amplifiers all of which when turned on serve to pass an RF signal (not shown) to the primary winding of one of a plurality of transformers $T_1$ through $T_n$. The secondary windings of these transformers are connected together in series with a load including a low pass filter 17 that involves a series circuit including an inductor 16 and a capacitor 18. This circuit is connected to an output load shown as a resistor 20 and which may represent a broadcasting antenna.

Depending upon the amplitude of the audio input 12, one or more of the power amplifiers will be turned on to provide a step voltage to load 20. An example of the step voltage is illustrated in FIG. 2.

Figure 2:
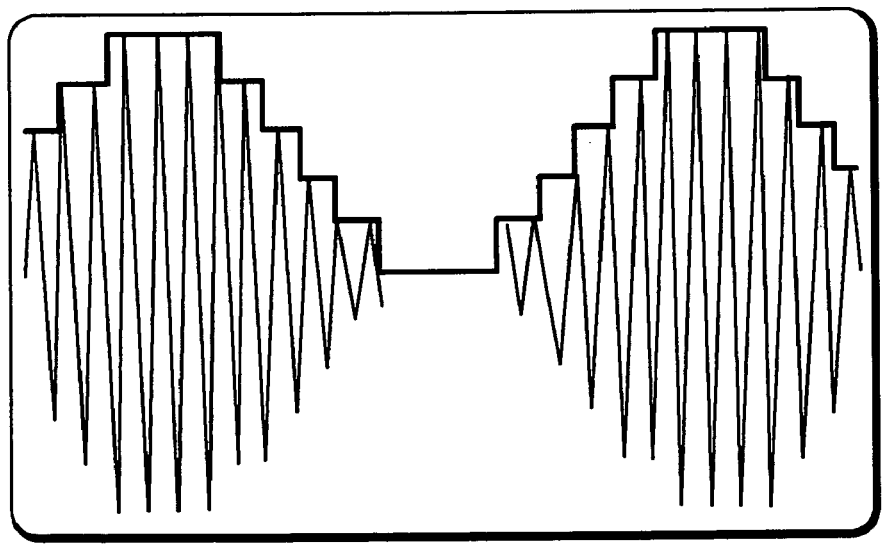
FIG. 2 is a graphical illustration showing the operation of the prior art circuitry of FIG. 1.

FIG. 2 illustrates equal steps. This technique, however, may require a large plurality of same power amplifiers to achieve good resolution.

Figure 3:
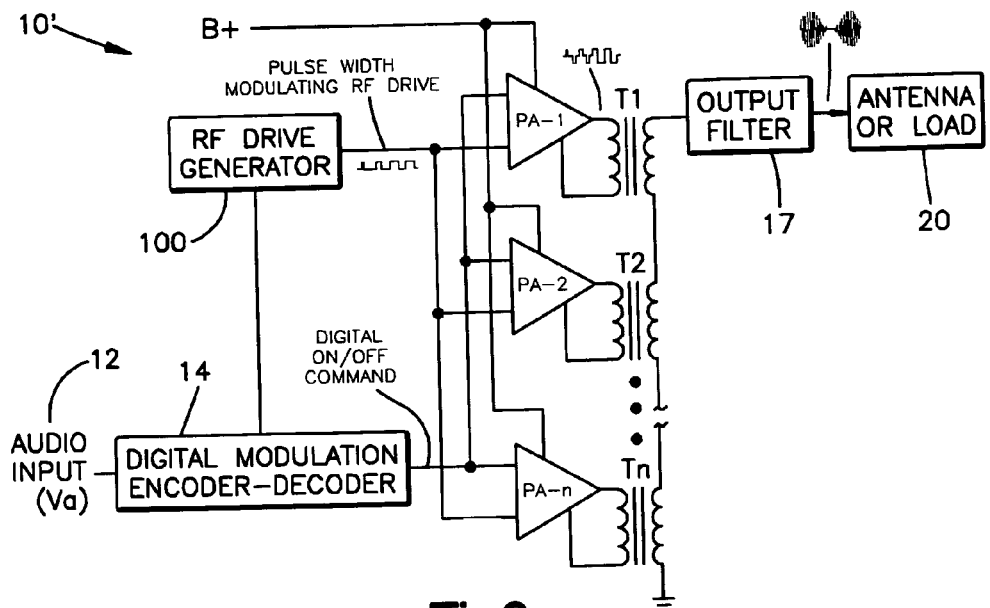
FIG. 3 is a schematic-block diagram illustration of a transmitter constructed in accordance with the invention.
Figure 4:
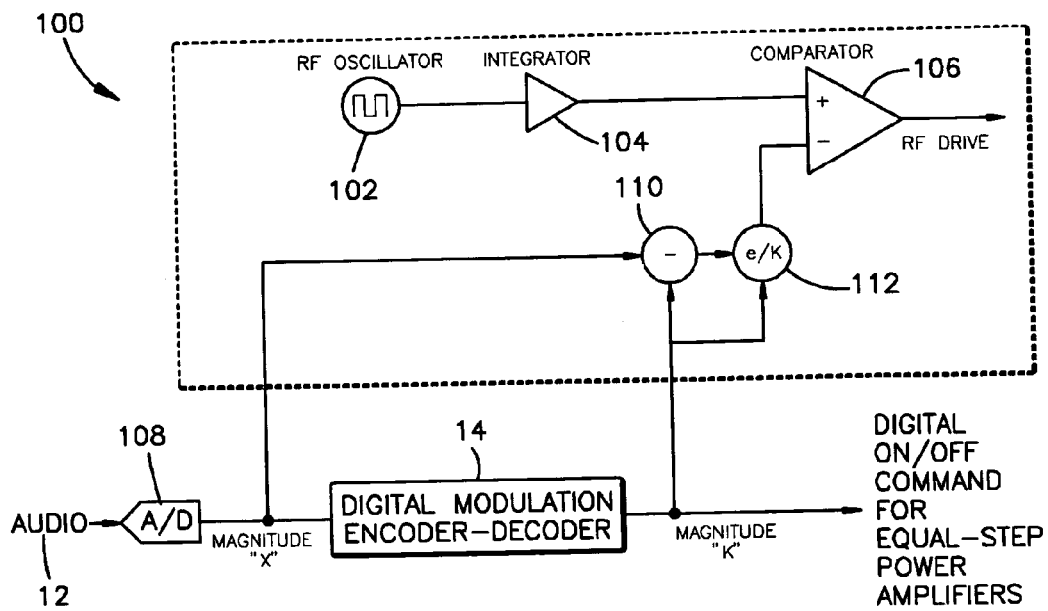
FIG. 4 is a schematic-block diagram illustration showing the RF drive generator and associated circuitry of FIG. 2 in greater detail.

Reference is now made to FIGS. 3 and 4 which illustrate a preferred embodiment of the present invention. To simplify the description herein, like components in FIG. 1 and in FIGS. 3 and 4 are identified with like character references and only the differences will be described herein in detail.

In accordance with this embodiment of the invention, a plurality of same power amplifiers PA-1 through PA-n are provided having exactly the same high frequency RF drive signal supplied to each amplifier from an RF generator 100. Because amplifiers PA-1 through PA-n are similar, the group delay, power gain, RF drives phase alignment, etc., with respect to each other will be coherent and maintain good linearity. When a small number of the same power amplifiers are used, as in the prior art, the output envelope will be very coarse as is illustrated in FIG. 2. Each power amplifier is independently controlled by an on/off command generated by the modulation encoder 14 to produce the desired envelope. The example presented in FIG. 2, assumes that 5 power amplifiers of the same power are employed. In a practical system, "n" is any number of power amplifiers that is greater than one. The staircase output presented in FIG. 2 is not usable for producing high fidelity signals.

In order to create a high fidelity amplitude modulated signal, there is a need to provide additional steps between each big step output. This new approach is described in detail below and presented in the schematic block diagram shown in FIGS. 3 and 4. This may be referred to as a pulse width modulating RF drive technique.

As shown in FIG. 3, the power amplifiers PA-1 to PA-n are identical power amplifiers powered by a B+ direct current (DC) power supply. The transformers T1-Tn are identical and the secondary windings are connected together in series to provide the desired output. The digital on/off commands are obtained as control signals generated by the digital modulation encoder-decoder 14 which enable the individual power amplifiers to generate a proper course output.

The output filter 17 is chosen to filter out all harmonic frequencies which are produced by the pulse width modulating rectangular waveform.

The RF drive generator 100 may take the form as illustrated in FIG. 4. As illustrated, an RF oscillator 102 provides an output to an integrator 104 that supplies the positive input of an operational amplifier serving as a comparator 106. The audio input 12 supplies an analog-to-digital converter 108 which, in turn, supplies a signal of a magnitude "X" to a summation device 110 serving as a subtractor. The digital modulation encoder/decoder 14 supplies an output having a magnitude "K" that is supplied as a second input to the subtractor 110. The output serves as an error signal e which is supplied to a ratio device 112 that supplies a ratio $\alpha$ to the negative input of the comparator 106 where $$\alpha = \frac{e}{K}.$$

The pulse width variation is defined as alpha, $$\left(\alpha = \frac{e}{K}\right),$$

and is inversely proportional to the number of power amplifiers that turned on. As K gets larger, the duty cycle variation needed gets smaller. K is defined as number of same power amplifier that are turned on. $1 \leq K \leq n$ $\alpha_0$ is the instantaneously RF drive duty cycle, and is defined as $\alpha_0 = 1 - \alpha$ Magnitude "K"=integer of magnitude "X"+1. This relationship defines the necessary output power amplifiers needed to produce a coarse output level. The on/off command control is a discrete control signal and it is addressing an integer number of power amplifier modules.

Assume n=5 of the same power amplifiers; it is the maximum output capable when all 5 power amplifiers are turned on with RF drive squarewave of 100%.

For example: Magnitude "X" is a digitized sample of an input audio signal. Let's assume the magnitude "X"=4.4. In order to synthesize the proper output level, Magnitude "K" is equal to the integer of "X"+1. Therefore; "K"=5 and e=K−X=0.6, an error signal or excess magnitude signal. Using value e=0.6, the RF drive duty cycle should be $$\alpha_0 = 1 - \alpha = 1 - \frac{e}{K} = 88\%.$$

An RF oscillator is applied to the input of the integrator, and therefore, the RF oscillator is translated to a symmetrical ramp signal. This signal is then applied to the inputs of the comparator to reconstruct back to a square wave RF drive signal with variable duty as described below.

A symmetrical ramp signal and alpha ($\alpha$) are applied to the inputs of the comparator, alpha is a representation of an error signal and is used to compare with the reference RF frequency ramp signal having a magnitude of unity or other define scale factor. If $\alpha=0$ then the output of the comparator will be a perfect square wave (100%, 50% on and 50% off). On the other hand, if $\alpha>0$, then the RF drive output of the comparator will no longer be symmetrical, the on time ($T_{on}$) of the square wave is shorter than the off time ($T_{off}$).

Relationship for these two signals are defined as: $T_{on}=1-T_{off}$, and $$T_{off} = \frac{1}{1+\alpha_0},$$

and $$\alpha_0 = \frac{T_{on}}{T_{off}}$$

Using these three formulas and substitute $\alpha_0=88\%$ then we get $T_{off}=53.2\%$ and $T_{on}=46.8\%$ The output magnitude can be reconstructed by the combination of digital step modulation and RF drive duty cycle modulation. With K=5 and RF drive duty cycle of 88%, this yields a net output envelope level of K $\alpha_0$=4.4, which is equal to the input magnitude "X" as required.

Figure 5:
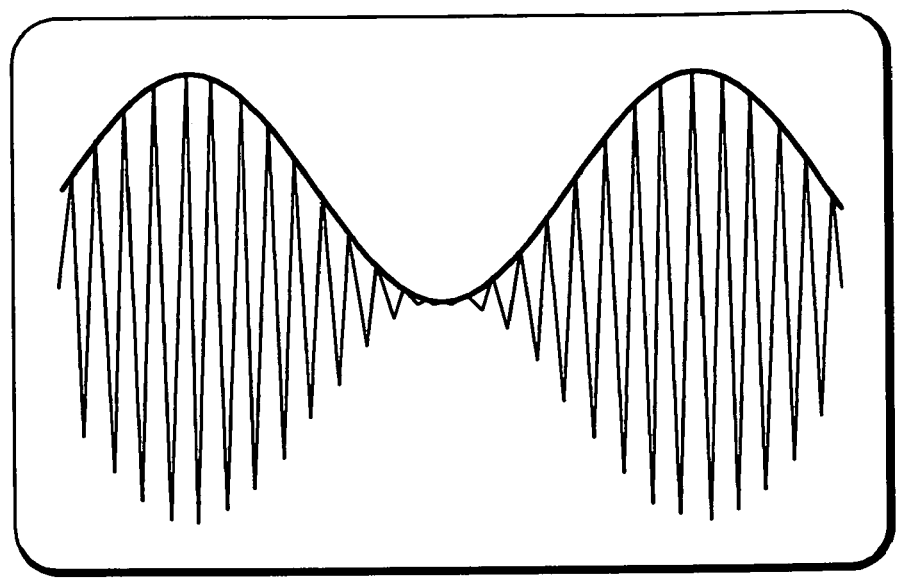
FIG. 5 is a graphical illustration showing the operation in accordance with the present invention.

The digital amplitude modulation achieved with the circuitry of FIGS. 3 and 4 is illustrated in FIG. 5 wherein the digital amplitude modulation with coarse step modulation and pulse width modulating RF drive is presented.

Figure 6:
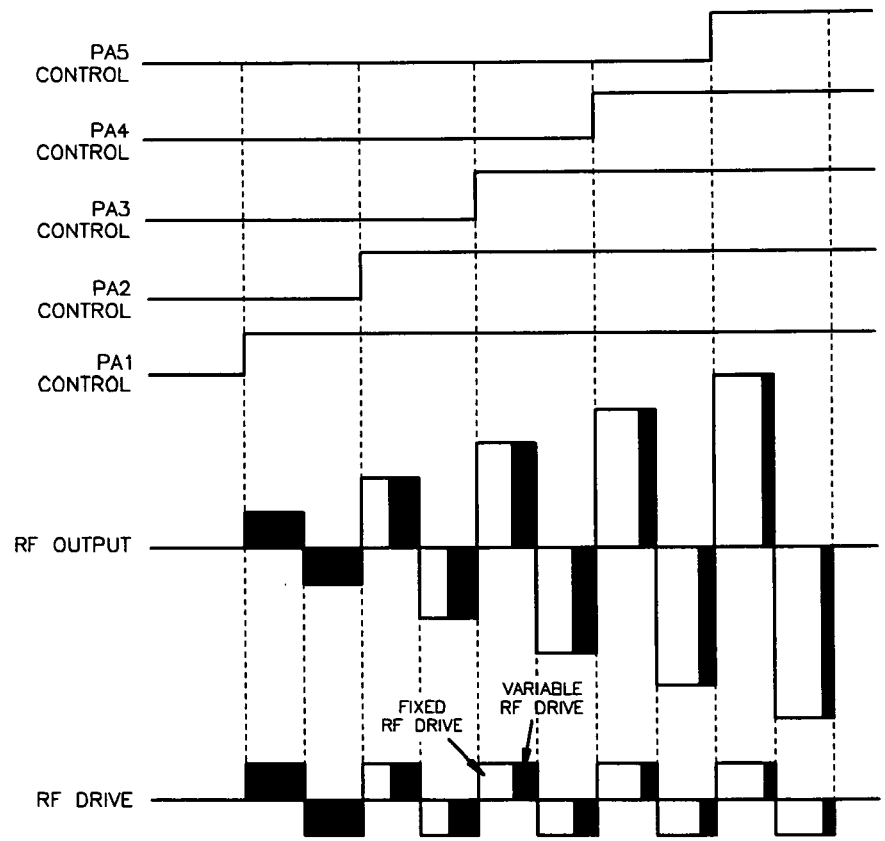
FIG. 6 is a graphical illustration showing timing diagrams illustrating the operation in accordance with the present invention.

Reference should also be made to FIG. 6 which illustrates a timing diagram for the operation of the circuitry presented in FIGS. 3 and 4.

Although the invention has been described in conjunction with a preferred embodiment, it is to be appreciated that various modifications may be made without departing from the spirit and scope of the invention as defined by the appended claims.

Having described the invention, I claim the following:

1. A digital amplitude modulation (AM) transmitter with pulse width modulating RF drive, comprising:

a plurality of RF amplifiers, each when turned on amplifying an applied RF drive signal by the same amount to provide a unit step RF output pulse of a fixed magnitude;

an encoder for supplying turn-on signals to turn on a number of said RF amplifiers wherein said number varies as a function of the value of an applied audio signal; and pulse width driver means to vary the pulse width of each said unit step RF output pulse as a function of the number of said RF amplifiers that are turned on.

2. A transmitter as set forth in claim 1 wherein the width of each said unit step output pulse is inversely proportional to the number of said RF amplifiers that are turned on.

3. A transmitter as set forth in claim 1 wherein said means to vary include circuitry for varying the width of each said RF output pulse.

4. A transmitter as set forth in claim 3 wherein said circuitry varies the width of each said RF output pulse inversely proportional to the number of said RF amplifiers that are turned on.

5. A transmitter as set forth in claim 3 wherein said circuitry includes means for determining the number of power amplifiers to turn on.

6. A transmitter as set forth in claim 5 wherein the width of each said unit step output pulse is inversely proportional to the number of said RF amplifiers that are turned on.

7. A transmitter as set forth in claim 6 wherein said circuitry varies the width of each said unit step output pulse inversely proportional to the number of said RF amplifiers that are turned on.

* * * * *